United States Patent [19]

Takase et al.

[11] Patent Number: 5,372,871
[45] Date of Patent: Dec. 13, 1994

[54] CIRCUIT BOARD FOR OPTICAL ELEMENT

[75] Inventors: Mitsuo Takase, Kamagaya; Nobuhiro Fukuda, Yokohama; Toshihiro Dodo, Chigasaki, all of Japan

[73] Assignee: Mitsui Toatsu Chemicals, Incorporated, Tokyo, Japan

[21] Appl. No.: 28,804

[22] Filed: Mar. 10, 1993

[30] Foreign Application Priority Data

| Mar. 10, 1992 | [JP] | Japan | 4-051277 |
| Mar. 10, 1992 | [JP] | Japan | 4-051278 |
| Jul. 6, 1992 | [JP] | Japan | 4-178279 |
| Aug. 5, 1992 | [JP] | Japan | 4-208839 |

[51] Int. Cl.$^5$ .............................. B32B 9/00
[52] U.S. Cl. .................. 428/209; 428/901; 250/208.1; 361/751
[58] Field of Search .......... 428/209, 210, 901, 195; 250/208.1; 361/400, 401, 402, 748, 751; 437/209

[56] References Cited

U.S. PATENT DOCUMENTS

| 3,935,333 | 1/1976 | Muneoka | 428/263 |
| 4,672,221 | 6/1987 | Saito | 250/208.1 |
| 4,719,345 | 1/1988 | Arita | 250/208.1 |
| 4,874,957 | 10/1989 | Sasaki | 250/208.1 |
| 5,216,805 | 6/1993 | Hallenbeck | 437/209 |

OTHER PUBLICATIONS

Coombs, "Printed Circuits Handbook," 3rd Ed. McGraw Hill, 1988, pp. 3.22, 3.23.

Primary Examiner—Patrick J. Ryan
Assistant Examiner—Patrick R. Jewik
Attorney, Agent, or Firm—Oblon, Spivak, McClelland, Maier & Neustadt

[57] ABSTRACT

The invention provides a circuit board for an optical element which is disposed in an optical reading apparatus or an optical writing apparatus and is used to irradiate document reading light upon an document or irradiate image writing light upon a photosensitive material through a lighting window thereof. The circuit board for an optical element comprises a transparent layer in the form of a film, one or a plurality of metal electrodes formed in a layered condition at a portion of a first principal surface of the transparent layer positioned on the light incidence side along the lighting window which is defined so as to extend perpendicularly to the moving direction of the document or the photosensitive material in order to transmit the light there through, and a conductive charge preventing layer a light intercepting property and formed at a portion of a second principal surface of the transparent layer, which is the opposite surface to the first principal surface of the transparent layer and is opposed to the original or the photosensitive material so as to define the lighting window. An optical reading element or a image writing optical element is mounted on the metal electrode or any of the metal electrodes.

28 Claims, 4 Drawing Sheets

CIRCUIT BOARD FOR OPTICAL ELEMENT

BACKGROUND OF THE INVENTION

1. Field of the Invention

This invention relates to an optical reading apparatus and/or an optical writing apparatus, and more particularly to a circuit board for an optical element for use with an optical printer.

2. Description of the Related Art

In recent years, employment of electronic technique spreads over a variety of fields from business machines to household furnishings, toys and so forth. Consequently, reduction in size and weight, increase in processing speed and improvement in accuracy and so forth proceed in various fields.

Particularly, in recent years, requirement for realization of simplicity, compactness and reduction in cost together with a high quality, a high gradation and a high resolution has been and is increasing in various image inputting terminal equipments beginning with a high speed facsimile, a small size scanner and a copying machine of the white board type as well as copying machines as represented by electronic photographs. Further, it has been examined by the inventors of the present invention to position, in order to achieve reduction of the output of a light source upon reading of an original, a reading semiconductor element and the original as near as possible.

In particular, an investigation has been made for a glass substrate or a plastic film of a very small thickness of 0.1 mm or less as a transparent base member for a circuit board on which semiconductor elements (of the type having pads made of gold or aluminum as terminals for connection to an external circuit board or of the bear chip type) can be mounted.

It is estimated that high integration and reduction in size and weight of electronic appliances will further proceed in the future. Even at present, flexible circuit boards which include a plastic film or a plastic sheet as a base member are used widely particularly to extremely bent portions or to those portions for which reduction in weight is desired.

The plastics have flexibility, and electrodes can be formed on the plastics readily by sputtering or vacuum vapor deposition. The plastics are superior also in productivity. However, the plastics are dielectrics and are liable to generate and be charged with static electricity by friction. The inventors of the present invention have found out that the charge has such an influence on semiconductor elements mounted on a circuit board formed from a base member of a plastic film or a like material that the output signals of the semiconductor elements suffer from an error or disturbance, resulting in noise of signals in the apparatus to cause a malfunction of the apparatus.

Further, in an optical reading apparatus, an original, which moves below a transparent circuit board in the form of a film, is illuminated by light emitted from a light source and transmitted through the circuit board to read the original, and in this instance, light from the light source is reflected by multipath reflection between the original and the circuit board. The inventors of the present invention have found out also that, since a reading light receiving element receives the light after multipath reflection, a disturbance occurs with the output signal of the light receiving element, and consequently, precise reading is not achieved.

SUMMARY OF THE INVENTION

It is an object of the present invention to provide a circuit board for an optical element wherein a transparent substrate or layer in the form of a film can be prevented from being charged and multipath reflection of light between a document (e.g. a printed paper) and the circuit board can be reduced and besides a semiconductor element can be mounted closely to the surface of the substrate (layer).

It is another object of the present invention to provide a circuit board for an optical element wherein admission of unnecessary light through a lighting window of the circuit board for an optical element, which makes a path of light from a light source, is minimized.

It is a further object of the present invention to provide a circuit board for an optical element onto which a semiconductor element can be mounted readily.

In order to attain the objects described above, a circuit board for an optical element of the present invention is disposed in an optical reading apparatus in an opposing relationship to a document which moves in the optical reading apparatus, and is used to irradiate light from a document reading light source upon the document through a lighting window thereof. The circuit board for an optical element comprises a substrate formed from a transparent layer in the form of a film, and one or a plurality of metal electrodes are formed on a first principal surface of the transparent layer, which is an incidence surface of light from the light source, along the lighting window so as not to disturb transmission of light of the lighting window which normally is in the form of a slit. A conductive charge preventing layer having a light intercepting property is formed on a second principal surface of the transparent layer, which is opposed to the document, so as to define the lighting window. In the case of the circuit board for an optical element, preferably the light intercepting layer is formed along and outside the lighting window so as not to cover an end or ends of the metal electrode or electrodes adjacent the lighting window.

The circuit board for an optical element can also be used with an optical writing apparatus similarly to the optical reading apparatus. In this instance, the charge preventing light intercepting layer may be disposed so as to be opposed to a photo sensitive surface of a photo sensitive material.

The circuit board for an optical element of the present invention is shown in FIGS. 1(A) to 1(C). In particular, single light intercepting layer 4 and a plurality of (4 pieces in the arrangement shown) metal electrodes 2 are formed on an upper surface (a first principal surface of transparent layer in FIG. 1(A)) of transparent layer 1. For the purpose to define a lighting window 5 in the form of a slit (lighting window 5 has two surfaces 5a and 5b), a pair of charge preventing layers 3 are formed along lighting window 5b on a lower surface of transparent layer 1, which is a second principal surface of transparent layer 1, so as to hold lighting window 5 therebetween as shown in FIG. 1(C). In the present invention, lighting window 5 is defined by a pair of charge preventing layers 3, and metal electrodes 2 and light intercepting layer 4 are formed at locations a little spaced from the outer edges of lighting window 5. Naturally, metal electrodes 2 and light intercepting layer 4 may otherwise be disposed so that the side faces thereof adjacent lighting window 5 may coincide just with the outer edges of lighting window 5, or they may project a little into lighting window 5 unless they do not interfere with original reading light which passes through lighting window 5.

As a modification to the invention shown in FIG. 1, light intercepting layer 4 may be omitted if light is intercepted sufficiently solely by charge preventing layer 3. The provision of a plurality of metal electrodes 2 along lighting window 5 is preferable in that a longitudinal optical element such as an array of light emitting elements or light receiving elements can be mounted at a large number of supporting points. In some cases, an optical element may be mounted between two metal electrodes. Further, the metal electrodes may be replaced by a single longitudinal metal electrode extending along the lighting window. Charge preventing layer 3 may alternatively be formed so as to surround the outer periphery of the lighting window as shown in FIG. 1(B).

Preferred forms of the present invention are described below. The transparent layer for use with the circuit board for an optical element preferably has a high transmission factor with regard to light of a light emitting element serving as a light source, and preferably, the transmission factor is higher than 70%, and more preferably, higher than 80%. Preferably, a plastic film is used to make the transparent substrate for its easiness of handling, flexibility and productivity. The optical path can be made short when using a transparent plastic film. As preferable substrates, plastic films made of polyester such as polyethylene terephthalate (PET) or polyethylene naphthalate or homopolymer or copolymer of polyamide, polyether, polysulfone, polyether sulfone (PES), polycarbonate, polyarylate, polyether imide, polyether ether ketone (PEEK) or polyimide. Further, the thickness of the plastic film normally is 5 to 500 $\mu$m, and preferably 10 to 100 $\mu$m.

As a material of the metal electrodes employed in the present invention, preferably a metal which is used as a material of an ordinary electrode such as Au, Ag, Ni, Cr, Cu or W, but from the electric characteristics, Cu is particularly preferable. An electrode may be formed by any of the following methods.

(1) A thin film of a metal such as copper is formed on a transparent layer (substrate) by vacuum processing or a like method, and then the film is changed into a thick film by electroplating or a like method.

(2) A metal electrode is formed directly on a transparent layer by electroless plating.

(3) Conductive ink is applied directly to a transparent layer to form an electrode.

(4) A metal foil piece of copper or a like metal is adhered to a transparent layer by means of a bonding agent to form an electrode.

(5) A transparent resin is cast on a metal foil piece of copper or a like metal to form an electrode.

On the other hand, when a metal electrode is to be formed by a vacuum processing method such as sputtering, ion plating, an ion cluster beam method, ionization vapor deposition or ion assisted vapor deposition, a forming method which makes use of ions such as sputtering, ion plating, an ion cluster beam method, ionization vapor deposition or ion assisted vapor deposition is preferably employed in order to improve the closely contacting condition between the transparent layer and the metal electrode. Further, a metal layer containing Ni or Cr therein may be formed as an intermediate layer between the metal electrode and the transparent layer.

The metal electrode in the present invention may be formed with a predetermined size on the first principal surface of the transparent board using a mask or a like element or may be formed by first forming a metal film on the entire first principal surface of the transparent layer and then etching the metal film into a pattern of a predetermined size. Any of the following methods can be employed as a method of forming a pattern of a metal electrode.

(1) Any other portion of a principal surface of a transparent layer except portions for metal electrodes is covered with a resist or a mask, and then a metal electrode having a predetermined circuit pattern is formed directly on the principal surface of the transparent layer, whereafter the resist and so forth are removed after formation of the pattern.

(2) A predetermined pattern of a metal electrode is formed, using a resist, on a metal film formed on a first principal surface of a transparent layer so as to cover the metal film, and then an unnecessary portion of the metal film is removed by etching, whereafter the resist is removed.

(3) A mask of a resist or a like material is formed at a portion of a metal film of copper or a like metal formed on the entire first principal surface of a transparent layer except a portion for a metal electrode of a predetermined pattern, and then the metal film is changed into a thick metal film by electroplating, whereafter the desired pattern of a metal electrode is formed. Thereafter, the resist is removed, and then, flash etching is performed to remove the unnecessary metal film while only leaving the metal electrode.

Formation of a plated gold layer on a metal electrode in the present invention is performed by popular gold plating which uses:

(1) a cyanogen alkali bath;
(2) a neutral or weak alkali bath; or
(3) a weak acid bath employing organic acid.

The thickness of a plated gold layer used in the present invention normally ranges from 0.05 $\mu$m to 50 $\mu$m.

In the present invention, a plated layer is formed on a metal electrode by any of the following methods.

(1) A plated layer is formed by solder plating in fluoroboric acid bath, a phenolsulfonic acid bath or an alkanolsulfonic acid bath.

(2) A plated layer is formed by plating of the substitution type or electroless plating such as reducing deposition.

(3) Solder paste such as creamy solder is printed by screen printing or a like printing method.

The thickness of a solder layer used in the present invention normally ranges from 0.5 $\mu$m to 50 $\mu$m, and preferably from 2 $\mu$m to 10 $\mu$m. Here, the solder is a metal or an alloy used to bond materials to each other and having a low melting point and particularly lower than 723 degrees by absolute temperature. In particular, the solder may be made of any of the metals of In, Sn, Pb or Zn or an alloy of those metals. A most popular material of the solder is a Sn-Pb alloy which makes up eutectic solder. Further, although not limited to the metals listed subsequently, the solder may be made of, for example, a Homberg's alloy, a Melotte's alloy, a Newton's alloy, a D'Arcet's alloy, a Lichtenberg's alloy, a Crose's alloy, a Rose's alloy, a Wood's alloy, a Lipowitz's alloy, a low melting point solder, an alkali resistant solder, an eutectic solder, a JIS solder, a low thermoelectromotive force solder or an aluminum solder.

Provision of a circuit board on which a solder layer is formed by plating or printing without using a high temperature molten solder bath allows reliable electric connection to a semiconductor element by the solder not only in a circuit board having a high heat resisting property but also a circuit board which employs a plastic film having a rather low heat resisting property.

The light transmittance of a light intercepting layer used in the present invention for light from a reading light source is equal to or lower than 50%, and preferably equal to or lower than 10%, and most preferably, equal to or lower than 5%. Further, the intercepting layer can be formed by any of the following methods.

(1) A light intercepting layer is formed from a metal layer by black chrome plating.

(2) A light intercepting layer is formed from a resin matrix into which a conductive filler of carbon black or/and metal particles of platinum black or a like metal is dispersed.

(3) A light intercepting layer is formed from a resin having pigment/die dispersed therein.

(4) A light intercepting layer is formed by layering on a transparent board a resin which itself has a light absorbing properly such as polythiophene.

The desirable thickness of the light intercepting layer in the present invention normally ranges from 0.05 $\mu$m to 50 $\mu$m, preferably from 1 $\mu$m to 10 $\mu$m, and most preferably from 2 $\mu$m to 5 $\mu$m.

In the present invention, the light intercepting effect is promoted by forming a light intercepting layer or layers on the area(s) between the patterned metal electrodes for connecting or wiring a semiconductor element (particularly an optical semiconductor element). In such a case, the light intercepting layer(s) is preferably formed by the method (3). In particular, since the light intercepting layer is formed on the first principal surface so that it may be opposed to a charge preventing layer formed on the second principal surface, the right intercepting layer cooperates with the charge preventing layer to prevent admission of light except light from the light source through the lighting window further effectively. In this instance, it is necessary for the light intercepting layer to have no bad influence on an electric signal generated upon reading of a document, and preferably the light intercepting layer is formed from a resin containing therein pigment/dye which is low in conductivity. In this instance, the light intercepting layer on the first principal surface, on which the metal electrode is formed, and the charge preventing layer formed on the second principal surface are required to define the lighting window for passing light from the original reading light source therethrough. The lighting window is normally defined as a straight slit and normally has the width of 0.1 mm to 50 mm, preferably 0.3 mm to 2 mm.

The charge preventing layer used in the present invention is characterized in that it has a light intercepting property for light of an operation wavelength of the light source and a light receiving element similarly to the light intercepting layer, and the light transmittance thereof for light from the light source is equal to or less than 50%, preferably equal to or less than 10%, and most preferably equal to or less than 5%. Any of the following methods may be employed as a method of forming a charge preventing layer on a second principal surface.

(1) A charge preventing layer is formed by plating such as black chrome plating or black chromate processing.

(2) A resin matrix in which a conductive filler such as carbon black or/and metal particles (for example, platinum black) is dispersed is printed and then hardened to form a charge preventing layer.

The charge preventing layer in the present invention preferably defines the lighting window for allowing light from the light source to be introduced to an original therethrough and allowing reflected light from the original to be transmitted therethrough. The lighting window is normally defined as a straight slit, and the width thereof normally ranges from 0.1 mm to 50 mm, preferably from 0.3 mm to 2 mm. The position of the lighting window may be disposed on the first principal surface of the transparent board. Alternatively, the lighting window may be defined by cooperation of the charge preventing layer and the light intercepting layer. The charge preventing layer in the present invention preferably has a width equal to or greater than the width of the lighting window. In particular, the width of the charge preventing layer is preferably equal to twice the width of the lighting window, and more preferably, five times or so. Further, the charge preventing layer preferably has an equal width on the light emitting element side and the light receiving element side thereof, and preferably has a greater width on the light receiving element side thereof. Particularly, the width of the charge preventing layer is 2 mm to 100 mm, preferably 3 mm to 10 mm.

The charge preventing layer in the present invention can be formed, when the heat resisting property of the transparent layer is high, by a popular method such as plating, vapor deposition, flame spray or application and heating. When the heat resisting property of the transparent layer is low such as when the transparent board is made of PET, polycarbonate or PES, the charge preventing layer is preferably formed at a temperature equal to or lower than 150° C., preferably equal to or lower than 120° C. and most preferably equal to or lower than 100° C. in order to prevent otherwise possible deformation of the transparent layer by heat upon formation of the charge preventing layer. Any of the following methods may be employed as a method of forming the charge preventing layer.

(1) A conductive filler such as carbon black is dispersed in advance in an epoxy resin of the one liquid type wherein microcapsules are degraded at a predetermined temperature and a catalyzer in the microcapsules reacts with a main agent so that it is hardened, and the epoxy resin is printed so as to have a lighting window, whereafter it is heated to the predetermined temperature so as to cause the reaction and hardening thereof to form a charge preventing layer.

(2) A conductive filler such as carbon black is dispersed in advance in a resin wherein a hardening agent dispersed in a main agent is degraded at a predetermined temperature and reacts with the main agent so that it is hardened, and the resin is printed so as to define a lighting window. The resin after printing is heated to the predetermined temperature so as to cause the reaction and hardening to form a charge preventing layer. It is also possible to provide a grounding electrode for the charge preventing layer and connect the grounding electrode to the ground in order to enhance the charge preventing effect.

While the transparent circuit board for an optical element of the present invention exhibits its functions sufficiently even with the construction described so far, in order to extend the life of a product which employs the circuit board for an optical element of the present invention, preferably a glass plate for promoting the abrasion resisting property is adhered to the charge preventing layer or an acrylic resin of the UV setting type, a silicone hard coating agent, a silica sol agent or a like agent is applied as a protective layer to the charge preventing layer. In this instance, particularly the protective layer is preferably provided so as to entirely cover over the charge preventing layer. The thickness of the protective layer is 1 μm to 20 μm, preferably 2 μm to 100 μm, and most preferably 5 μm to 20 μm.

Further, in order to assure a high durability of the electric connection between an optical reading element and the circuit board for an optical element, the entire element may be covered with a resin of the hardening type. The resin of the hardening type here may be selected from a resin of the UV setting type as represented by an acrylic resin of the UV setting type, a thermosetting resin, and a resin of the cold setting type such as an epoxy resin.

DETAILED DESCRIPTION OF THE PREFERRED EMBODIMENTS

Several examples of the present invention are described below with reference to the drawings.

EXAMPLE 1

Figure 1A:
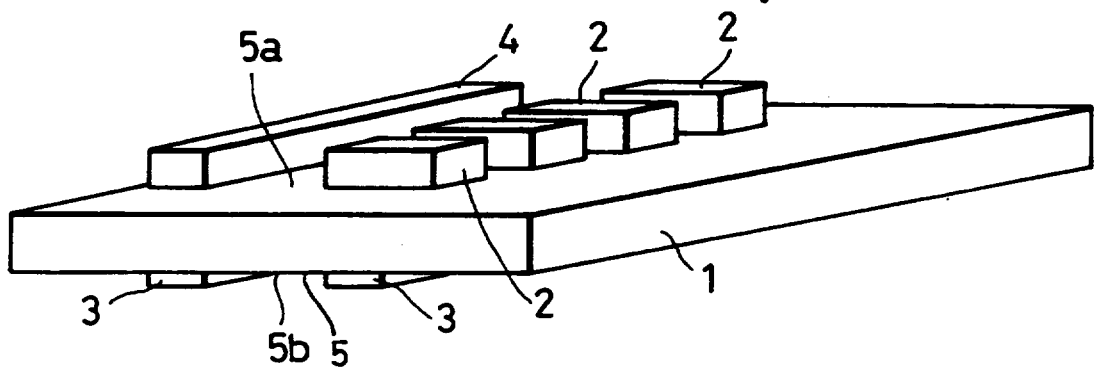
FIG. 1(A) is a perspective view showing the construction of a circuit board for an optical element of the present invention.
Figure 1B:
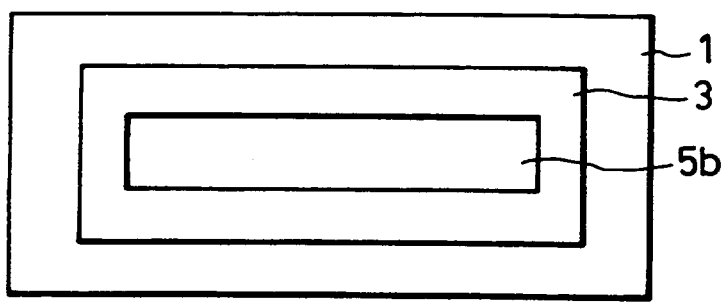
FIGS. 1(B) and 1(C) are plan views showing different forms of the charge preventing layer of the circuit board shown in FIG. 1(A)
Figure 1C:
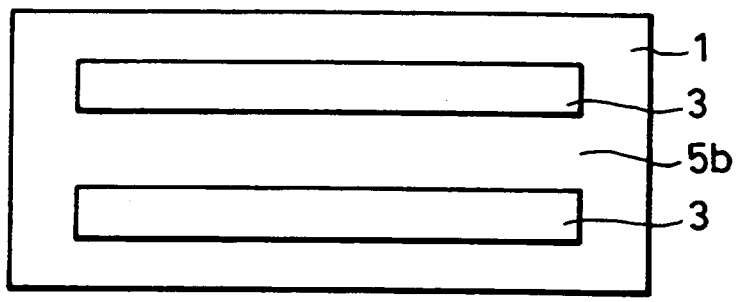
Figure 2:
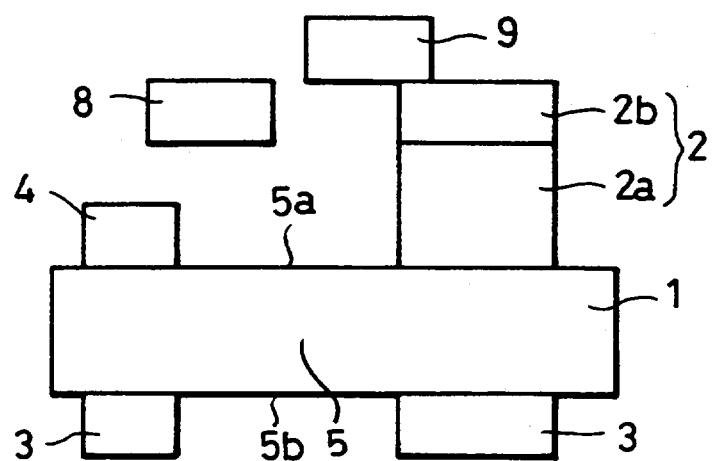
FIG. 2 is a sectional view showing examples 1, 2 and 3 of the circuit board for an optical element of the present invention.

Example 1 is described with reference to FIG. 2. Thin copper film 2a (0.5 μm thick) was formed by DC magnetron sputtering on a first principal surface (upper surface in FIG. 2) of transparent layer 1 formed from a PES film 50 μm thick, and then, resist ink was printed in a predetermined pattern. After printing, a copper layer (15 μm thick) was formed by electroplating, and then, solder layer 2b (about 5 μm thick) made of a Sn-Pb alloy was formed in an alkanolsulfonic acid bath by electroplating. After removal of the resist, the unnecessary thin copper film was removed by flash etching to form metal electrode 2 having a predetermined pattern.

A mixture solution of a thermosetting resin containing carbon black particles therein was applied to both of the first principal surface, on which metal electrode 2 was formed, and a second principal surface (lower surface in FIG. 2) by screen printing so as to define lighting windows 5a and 5b (lighting window 5 has two surfaces 5a and 5b) through which light from a light source can be transmitted, and thereafter, the thermosetting resin was heated to be hardened to form light intercepting layer 4 and charge preventing layer 3. In the case of the present example, since light intercepting layer 4 is not formed on metal electrode 2, light intercepting layer 4 on the first principal surface may have conductivity. Further, while lighting window 5a is formed larger than lighting window 5b, it may be formed otherwise with the same size as lighting window 5b so that it may overlap with lighting window 5b.

The surface resistance of the charge preventing layer in the present example was $10^3$ Ω/□. The light transmittance values of the light intercepting layer and the charge preventing layer other than the lighting windows were equal to or less than 1%. Further, an optical reading element (light receiving element) having bumps for connection was bonded in 5 minutes at 180° C. to solder layer 2b of metal electrode 2 of the circuit board for an optical element. There was no peeling nor crack at any bonded portion, and light from light source 8 (in the present example, light source 8 is not mounted directly on the circuit board for an optical element) was irradiated through lighting windows 5a and 5b upon a document (a printed paper) to be read passing below the second principal surface while reflected light was received through lighting windows 5a and 5b by element 9 to effect reading by means of a reading apparatus. It was proved that reading was performed regularly.

EXAMPLE 2

Example 2 is described with reference to FIG. 2. A copper film (3 μm thick) was formed by DC magnetron sputtering on a first principal surface of transparent layer 1 made of a uniaxial oriented PEEK film (25 μm thick), and resist ink was printed on the copper film so as to form a predetermined pattern. Then, the unnecessary copper film was removed by etching. Thereafter, solder layer 2b (about 1 μm thick) made of a Sn-Pb alloy was formed by substitution solder plating to produce metal electrode 2. After light intercepting layer 4 and charge preventing layer 3 were formed in a similar manner as in Example 1, bonding to an optical reading element was performed. It was confirmed that there was no peeling nor crack occurring at any joined portion and a reading apparatus operated regularly.

EXAMPLE 3

When bonding between the circuit board for an optical element produced in Example 1 and an optical reading element was to be performed, a pressure of 2 kg/cm² per one bump was applied for 5 minutes while heating it to 150° C. As a result, there was no peeling nor crack occurring at any joined portion, and a reading apparatus operated regularly.

EXAMPLE 4

Figure 3:
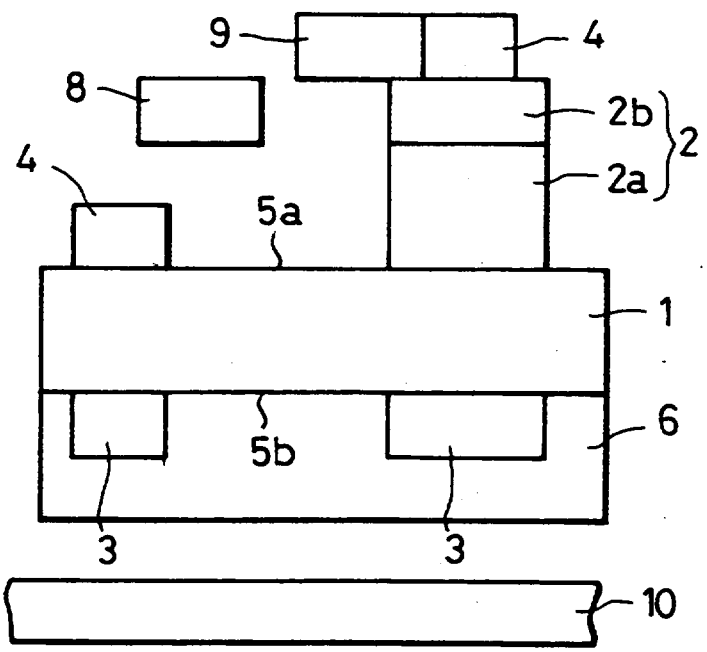
FIG. 3 is a sectional view showing examples 4, 5, 7, 8 and 9 of the present invention.

Example 4 is described with reference to FIG. 3. Protective layer 6 was formed on the second principal surface of the circuit board for an optical element produced in Example 1. Protective layer 6 is made of an urethane acrylic resin of the UV (ultraviolet rays) setting type and has the thickness of 10 μm. Bonding of an optical reading element 9 to the circuit board for an optical element of the present example was performed by hot blast circulating heating (140° C.). It was confirmed that there was no crack at any bonded portion and a reading apparatus operated regularly.

EXAMPLE 5

Figure 4:
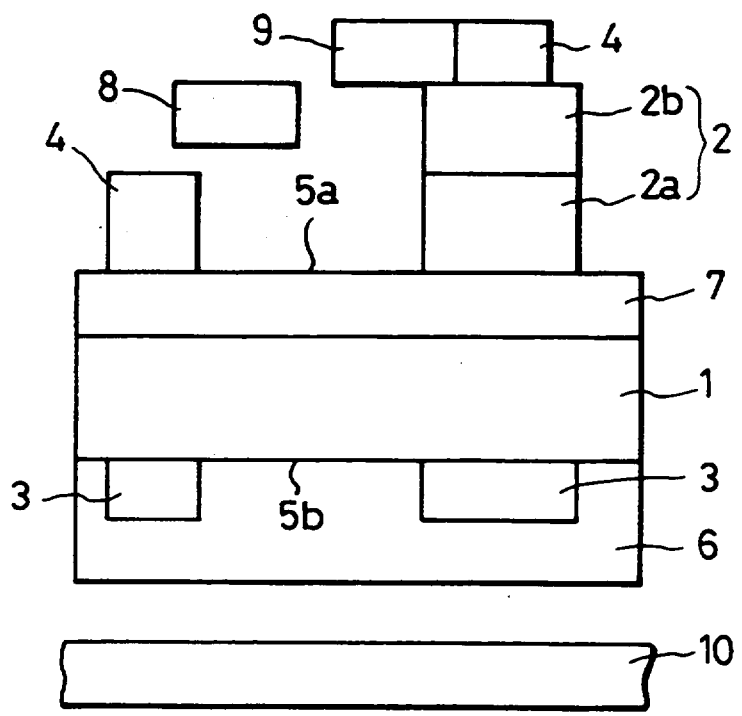
FIG. 4 is a sectional view showing an example 6 of the present invention.

Example 5 is described with reference to FIG. 4. A thin copper film (1 μm thick) was formed by DC magnetron sputtering on a first principal surface of a Kapton V film. Then, a copper film (10 μm thick) was formed in a copper sulfate bath by electroplating. Thereafter, resist ink was printed in a predetermined pattern, and etching was performed using ferric chloride solution, whereafter the resist ink was removed. Further, a Ni film (2 μm thick) was formed by plating, and then, plated gold layer 2b (0.2 μm thick) was formed to produce metal electrode 2.

A resin containing black pigment therein was applied to the first principal surface so as not to cover lighting window 5a, and Structbond 920 (manufactured by Mitsui Toatsu Chemicals, Inc.) containing carbon black particles therein was applied to the second principal surface so as to define lighting window 5b, and then the Kapton V film was heated to form light intercepting layer 4 having an electric insulating property and charge preventing layer 3 having a conductivity. Thereafter, protective layer 6 similar to that in Example 4 was formed in parallel to the second principal surface of transparent layer 1 so as to cover charge preventing layer 3 and lighting window 5b. Protective layer 6 protects the charge preventing layer and the lighting window from friction by document 10 or some other material which moves just below the second principal surface.

The circuit board for an optical element of the present example and reading element 9 having aluminum pads were pressed to each other for 30 seconds at 200° C. to join them. Thereafter, while element 9 was held pressed, a transparent thermosetting resin of the polyester type was applied so as to be filled uniformly between transparent layer 1 and element 9. Thereafter, the resin was heated to 140° C. for 20 seconds so that it was hardened to reinforce the joining between element 9 and metal electrode 2. It was confirmed that there was no peeling at any bonded portion and a reading apparatus operated regularly.

EXAMPLE 6

Example 6 is described with reference to FIG. 4. Copper foil (18 μm thick) having a Ni-Cu alloy layer was layered, using an epoxy bonding agent, on a first principal surface of transparent layer 1 formed from a PES film (50 μm thick). Then, resist ink was applied so as to form a predetermined pattern and a light intercepting layer, and the copper foil was etched using ferric chloride solution, whereafter the resist ink was removed to form metal electrode layer 2a and light intercepting layer 4. Solder layer 2b similar to that in Example 1 was provided on metal electrode layer 2a to form an electric bonding layer. Further, colored resin Raycure 4200 (manufactured by Jujo Kako Inc.) of the UV setting type was printed on metal electrode 2 to form a light intercepting layer having an insulation property. Then, Structbond 920 (manufactured by Mitsui Toatsu Chemicals, Inc.) containing carbon black particles therein was applied to the second principal surface so as to be opposed to lighting window 5a formed on the first principal surface, thereby to form a light intercepting layer and a charge preventing layer. Further, a protective layer similar to that in Example 5 was formed so as to cover over the charge preventing layer.

Bonding between the circuit board for an optical element of the present embodiment and a reading element was performed by hot blast circulating heating (120° C.). It was confirmed that there was no crack at any joined portion and a reading apparatus operated regularly.

EXAMPLE 7

Example 7 is described with reference to FIG. 3. A thin copper film of (0.5 μm thick) was formed by DC magnetron sputtering on a first principal surface of transparent layer 1 formed from a PES film (50 μm thick), and then, resist ink was printed so as to form a predetermined pattern, whereafter copper film 2a (about 5 μm thick) was formed by electroplating. Further, tin layer 2b (about 5 μm thick) was formed by electroplating. After the resist was removed, the unnecessary copper film was removed by flash etching to form metal electrode having a predetermined pattern.

A resin containing black pigment therein was printed on the first principal surface so as not to cover lighting window 5a to form a light intercepting layer, and Structbond 920 (manufactured by Mitsui Toatsu Chemicals, Inc.) containing carbon black particles therein was applied to the second principal surface so as to define lighting window 5b, whereafter heat was applied to harden the resin to form a light intercepting layer having an electric insulating property and a charge preventing layer having conductivity. Then, protective layer 6 similar to that in Example 5 was formed so as to cover charge preventing layer 3.

Metal electrode 2 of the circuit board for an optical element of the present embodiment and an optical reading element 9 having pads of Au were pressed to each other for 30 seconds at 200° C. to bond them. Thereafter, while they were held pressed to each other, a transparent thermosetting resin of the polyester type was applied to the circuit board so as to cover over the entire area of reading element 9, and the circuit board was kept at 140° C. for 20 minutes to harden the resin. It was confirmed that there was no peeling at any bonded portion and a reading apparatus operated regularly.

EXAMPLE 8

Example 8 is described with reference to FIG. 3. A thin copper film (0.5 μm thick) was formed by DC magnetron sputtering on a first principal surface of transparent layer 1 formed from a PES film (50 μm thick), and resist ink was printed so as to form a predetermined pattern to make a metal electrode, whereafter a copper film (about 5 μm thick) was formed by electroplating. Further, a solder layer of about 5 μm made of a Sn-Pb (60 Sn/40 Pb) alloy was formed by solder plating in an alkanolsulfonic acid bath.

After the resist was removed, the necessary thin copper film was removed by flash etching to form metal electrode 2 having the predetermined pattern.

A resin containing black pigment therein was printed on the first principal surface so as not to cover lighting window 5a to form an insulating light intercepting layer. Structbond 920 (manufactured by Mitsui Toatsu Chemicals, Inc.) containing carbon black particles therein was applied to the second principal surface so as to define a lighting window, and then, heat was applied to harden the resin to form light intercepting layer 4 and charge preventing layer 3. The surface resistance of charge preventing layer 3 was $10^3$ Ω/□.

Thereafter, a transparent urethane acrylic resin of the UV setting type was formed as protective layer 6 with the thickness of 10 μm on charge preventing layer 3 and lighting window 5b. An optical reading element 9 having bumps thereon was kept for 4 minutes at 190° C. while it was pressed against metal electrode 2 of the circuit board for an optical element thus produced to effect bonding of element 9. Further, protective layer 6 was provided. It was confirmed that, since protective layer 6 was provided, the friction resisting property of the circuit board for an optical element with an original was improved and the life of the reading apparatus was extended remarkably.

EXAMPLE 10

Figure 5:
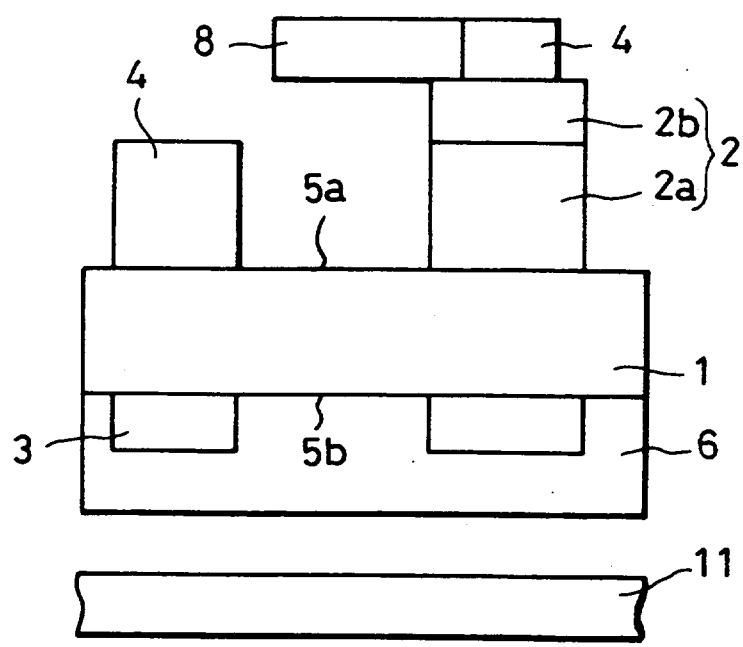
FIG. 5 is a sectional view showing an example 10 of the present invention.

Example 10 is described with reference to FIG. 5. A thin copper film (0.5 μm thick) was formed by DC magnetron sputtering on a first principal surface of transparent layer 1 formed from a polyarylate film (50 μm thick), and resist ink was printed on the thin copper film except a pattern in which a metal electrode was to be formed, whereafter a copper film (about 5 μm thick) was formed by electroplating. Further, a solder layer (about 5 μm thick) made of a Sn-Pn (60 Sn/40 Pb) alloy was formed in an alkanolsulfonic acid bath. After the resist was removed, the unnecessary thin copper film was removed by flash etching to form metal electrode 2.

A resin containing black pigment therein was printed on the first principal surface of transparent layer 1 so as not to cover lighting window 5a to form light intercepting layer 4 having an insulating property. Further, Structbond 920 (manufactured by Mitsui Toatsu Chemicals, Inc.) containing carbon black particles therein was applied to the second principal surface of transparent board 1 so as to define lighting window 5b, and then heat was applied to harden the resin to form a charge preventing layer having a light intercepting property. The surface resistance of charge preventing layer 3 was $10^3$ Ω/□. Protective layer 6 made of a transparent urethane acrylic resin of the UV setting type was formed with the thickness of 10 μm so as to cover over charge preventing layer 3 and lighting window 5b.

An LED array was pressed against metal electrode 2 on the circuit board for an optical element thus produced under the pressure of 6 kg/cm$^2$ or so and then heated to and kept at 140° C. for 4 minutes to effect bonding. It was confirmed that there was no peeling nor crack at any bonded portion and, when an image was formed on photosensitive material. 11 of an optical printer using the circuit board for an optical element, it operated regularly.

Further, also when, in any of the examples described above, a grounding electrode connected to the charge preventing layer was provided and connected to the ground, a good result was obtained.

Next, comparative examples are described.

COMPARATIVE EXAMPLE 1

Figure 6:
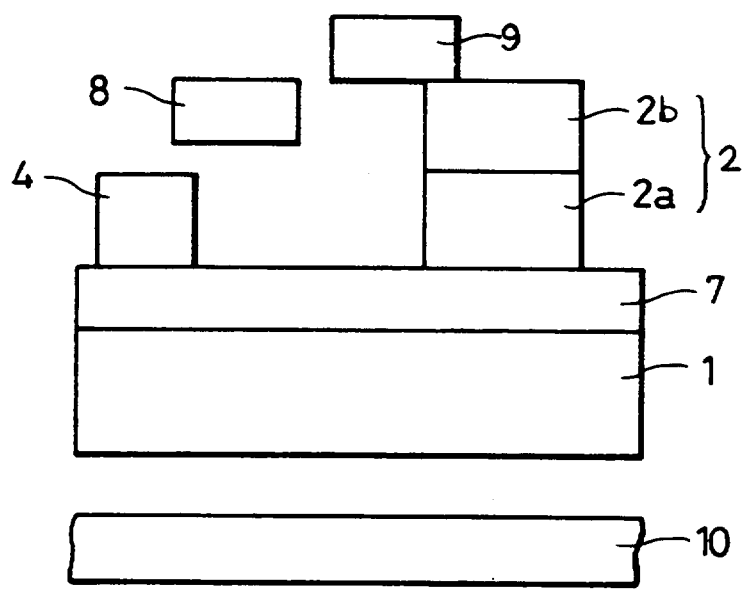
FIG. 6 is a sectional view showing the construction of a comparative example 1.

Comparative Example 1 is described with reference to FIG. 6. Copper foil, of 18 μm thick having a Ni-Cu alloy layer thereon was layered on a first principal surface of transparent layer 1 formed from a PES film of 50 μm thick using a bonding agent of the epoxy type. Then, resist ink was applied in a predetermined pattern to make a metal electrode and a portion corresponding to a light intercepting layer, and the copper foil was etched using ferric chloride solution, whereafter the resist ink was removed to form metal electrode layer 2a and light intercepting layer 4. Solder layer 2b similar to that in Example 1 was provided on metal electrode layer 2a to make an electric bonding layer.

An optical reading element 9 was bonded to the circuit board for an optical element produced in this manner by hot blast circulating heating (120° C.). While there was no crack at any bonded portion, static electricity was induced, upon reading of an document, by friction between the transparent board and the document and noise was produced in a read signal. Further, a black output, which was considered to arise from admission of light from any other portion than light source 8 or multipath reflection of light from light source 8 between document 10 and the circuit board, became high, and it was confirmed that the reading sensitivity was deteriorated.

COMPARATIVE EXAMPLE 2

A thin copper film of 0.5 μm thick was formed by DC magnetron sputtering on a first principal surface of a transparent board formed from a PES film of 50 μm thick, and resist ink was printed in a predetermined pattern, whereafter a copper film of about 5 μm thick was formed by electroplating. The transparent board was soaked into a molten solder bath of 240° C. in order to try to form a solder layer. However, the film was contracted, and no product which can be utilized as a circuit board for an optical element was obtained.

As apparent also from the examples described above, a circuit board for an optical element of the construction of the present invention allows electric bonding of a high degree of reliability not only when a base material having a high heat resisting property is employed as a transparent board but also when a base material of a plastic film having a rather low heat resisting property is employed as a transparent layer, and also allows prevention of charging. Further, it allows prevention of admission of light from any other element than a light source and prevention of multipath reflection of light from an original. As a result, it is possible to provide circuit boards for use with various optical instruments of the fully contacting type which employ no lens and circuit boards for use with reading apparatus for copying machines of the white board type and so forth as well as circuit boards for use with optical printers as image forming apparatus for forming electronic photographs and so forth. Consequently, the inventors of the present invention are confident, that the present invention significantly contributes to the semiconductor application industry.

What is claimed is:

1. A circuit board having a lighting window for an optical element which is disposed in an optical reading apparatus in an opposing relationship to a document which moves in said optical reading apparatus, the lighting window guiding a document reading light from a light source onto the document therethrough and directing the reflecting light from the document therethrough to photosensors, comprising:

a transparent layer in the form of a plastic film having first and second opposed principal surfaces, said lighting window being within said transparent layer;

one or a plurality of metal electrodes formed in a layered condition at a portion of the first principal surface of said transparent layer positioned adjacent to said light source along the first principal surface side of said lighting window which is defined so as to extend transversely to the moving direction of the document in order to transmit the document reading light therethrough; and a conductive charge preventing layer having a light intercepting property and being effective to eliminate static electricity caused by friction formed at a portion of the second principal surface to said transparent layer, which is the opposite surface to said first principal surface of said transparent layer and is opposed to the document, so as to define the second principal surface of said lighting window, wherein said charge preventing layer is made of a resin in which carbon black particles or metal particles are dispersed.

2. A circuit board for an optical element as claimed in claim 1, wherein said charge preventing layer is formed so as to surround said lighting window.

3. A circuit board for an optical element as claimed in claim 1, wherein said charge preventing layer comprises two separate layers formed along the second principal surface of said lighting window so as to extend transversely to the moving direction of the document.

4. A circuit board for an optical element as claimed in claim 1, wherein said metal electrode or electrodes are made of a metal selected from the group consisting of Au, Ag, Ni, Cr, Cu and W.

5. A circuit board for an optical element as claimed in claim 1, wherein said metal electrode or electrodes are constituted from a first metal layer formed on said transparent layer, and a second metal layer formed on said first metal layer.

6. A circuit board for an optical element as claimed in claim 5, wherein said first metal layer is made of a metal selected from the group consisting of Au, Ag, Ni, Cr, Cu and W, and said second metal layer is capable to mounting an electric part thereon by pressure fixation or fusion fixation.

7. A circuit board for an optical element as claimed in claim 6, wherein said second metal layer is formed from a plated gold.

8. A circuit board for an optical element as claimed in claim 6, wherein said second metal layer is formed from plated solder.

9. A circuit board for an optical element as claimed in claim 6, wherein said second metal layer is formed from printed solder.

10. A circuit board for an optical element as claimed in claim 1, further comprising a transparent protective layer which covers said second principal surface side of said lighting window.

11. A circuit board for an optical element as claimed in claim 1, further having a light intercepting layer formed along and outside said first principal surface side of the lighting window in such a manner so as to permit said document reading light to pass through the lighting window onto the document and directing the reflecting light from the document to said photosensors.

12. A circuit board for an optical element as claimed in claim 11, wherein said conductive charge preventing layer is formed so as to surround said lighting window.

13. A circuit board for an optical element as claimed in claim 11, wherein said charge preventing layer comprises two separate layers formed along the second principal surface of said lighting window so as to extend transversely to the moving direction of the document.

14. A circuit board for an optical element as claimed in claim 11, wherein said metal electrode or electrodes are made of metal a selected from the group consisting of Au, Ag, Ni, Cr, Cu and W.

15. A circuit board for an optical element as claimed in claim 11, wherein said metal electrode or electrodes are constituted from a first metal layer formed on said transparent layer, and a second metal layer formed on said first metal layer.

16. A circuit board for an optical element as claimed in claim 15, wherein said first metal layer is made of a metal selected from the group consisting of Au, Ag, Ni, Cr, Cu and W, and said second metal layer is capable of mounting an electric part thereon by pressure fixation or fusion fixation.

17. A circuit board for an optical element as claimed in claim 16, wherein said second metal layer is formed from a plated gold.

18. A circuit board for an optical element as claimed in claim 16, wherein said second metal layer is formed from plated solder.

19. A circuit board for an optical element as claimed in claim 16, wherein said second metal layer is formed from printed solder.

20. A circuit board having a lighting window for an optical element which is disposed in an optical writing apparatus in an opposing relationship to a photosensitive surface of a photosensitive material which moves in said optical writing apparatus, the lighting window guiding the light from an image-forming light source onto said photosensitive surface therethrough, comprising:

a transparent layer in the form of a plastic film having first and second principal surfaces, said lighting window being within said transparent layer;

one or a plurality of metal electrodes formed in a layered condition at a portion of the first principal surface of said transparent layer positioned adjacent said light source along the first principal surface side of said lighting window which is defined so as to extend transversely to the moving direction of said photosensitive surface in order to transmit the image forming light therethrough;

a light intercepting layer formed along an outer edge of and outside said first principal surface side of the lighting window in such a manner so as to permit said light form an image-forming light source to pass through said lighting window onto said photo sensitive surface; and a conductive charge preventing layer made of a resin in which carbon black particles or metal particles are dispersed having a light intercepting property and being effective to eliminate static electricity caused by friction of the moving photo sensitive surface formed at a portion of the second principal surface of said transparent layer, which is the opposite surface to said first principal surface of said transparent layer and is opposed to said photosensitive surface, so as to define the second principal surface of said lighting window.

21. A circuit board for an optical element as claimed in claim 20, wherein said conductive charge preventing layer is formed so as to surround said lighting window.

22. A circuit board for an optical element as claimed in claim 20, wherein said charge preventing layers comprises two separate layers formed on the second principal surface of said lighting window so as to extend transversely to the moving direction of said photosensitive surface.

23. A circuit board for an optical element as claimed in claim 20, wherein said metal electrode or electrodes are made of a metal selected from the group consisting of Au, Ag, Ni, Cr, Cu and W.

24. A circuit board for an optical element as claimed in claim 20, wherein said metal electrode or electrodes are constituted from a first metal layer formed on said transparent layer, and a second metal layer formed on said first metal layer.

25. A circuit board for an optical element as claimed in claim 24, wherein said first metal layer is made of a metal selected from the group consisting of Au, Ag, Ni, Cr, Cu and W, and said second metal layer is capable of mounting an electric part thereon by pressure fixation or fusion fixation.

26. A circuit board for an optical element as claimed in claim 25, wherein said second metal layer is formed from a plated gold.

27. A circuit board for an optical element as claimed in claim 25, wherein said second metal layer is formed from plated solder.

28. A circuit board for an optical element as claimed in claim 25, wherein said second metal layer is formed from printed solder.

* * * * *